(12) United States Patent
Murari

(10) Patent No.: US 12,189,260 B2
(45) Date of Patent: Jan. 7, 2025

(54) MULTI-LAYER DEVICE INCLUDING A LIGHT-TRANSMISSIVE ELECTRODE LAYER COMPRISING A POROUS MESH OR POROUS SPHERES

(71) Applicant: E Ink Corporation, Billerica, MA (US)

(72) Inventor: Nishit Murari, Billerica, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 18/071,155

(22) Filed: Nov. 29, 2022

(65) Prior Publication Data

US 2023/0197310 A1 Jun. 22, 2023

Related U.S. Application Data

(60) Provisional application No. 63/291,485, filed on Dec. 20, 2021.

(51) Int. Cl.
*G02F 1/1676* (2019.01)
*C08J 3/075* (2006.01)
(Continued)

(52) U.S. Cl.
CPC ............ *G02F 1/1676* (2019.01); *C08J 3/075* (2013.01); *C08J 3/24* (2013.01); *C08K 3/04* (2013.01); *C08K 3/16* (2013.01); *C08K 3/22* (2013.01); *G02F 1/1306* (2013.01); *G02F 1/13439* (2013.01); *G02F 1/167* (2013.01); *G02F 1/16757* (2019.01); *H01B 1/04* (2013.01); *H01B 1/124* (2013.01); *H01L 27/142* (2013.01); *H01L 31/03926* (2013.01); *H10K 59/88* (2023.02);
(Continued)

(58) Field of Classification Search
CPC ... G02F 1/1309; G02F 1/1676; H10K 71/861; C08J 2305/04; C08J 2329/04; C08J 3/24; C08J 3/075; C08K 3/22
See application file for complete search history.

(56) References Cited

U.S. PATENT DOCUMENTS

| 4,339,295 A | 7/1982 | Boretos et al. |
| 5,665,477 A | 9/1997 | Meathrel et al. |

(Continued)

FOREIGN PATENT DOCUMENTS

| JP | H09282938 A | * 10/1997 | |
| JP | H10501173 A | * 2/1998 | .............. B01J 13/02 |

OTHER PUBLICATIONS

Wood, D., "An Electrochromic Renaissance?" Information Display, 18(3), 24 (Mar. 2002).

(Continued)

*Primary Examiner* — Sophie Hon
(74) *Attorney, Agent, or Firm* — Ioannis Constantinides

(57) ABSTRACT

A multi-layer device and its method of manufacture are disclosed. The multi-layer device comprises a first electrode layer, a first repair layer, a functional layer, and a second electrode layer. The first repair layer comprises a conductive hydrogel film or conductive hydrogel beads, the conductive hydrogel film or the conductive hydrogel beads comprising conductive filler particles dispersed in a cross-linked polymer. The repair layer protects the multi-layer device from electrical short circuits. A multilayer device is also disclosed including a light-transmissive electrode layer comprising a porous mesh or porous spheres.

6 Claims, 16 Drawing Sheets

(51) Int. Cl.
| | |
|---|---|
| *C08J 3/24* | (2006.01) |
| *C08K 3/04* | (2006.01) |
| *C08K 3/16* | (2006.01) |
| *C08K 3/22* | (2006.01) |
| *G02F 1/13* | (2006.01) |
| *G02F 1/1343* | (2006.01) |
| *G02F 1/167* | (2019.01) |
| *G02F 1/16757* | (2019.01) |
| *H01B 1/04* | (2006.01) |
| *H01B 1/12* | (2006.01) |
| *H01L 27/142* | (2014.01) |
| *H01L 31/0392* | (2006.01) |
| *H10K 59/88* | (2023.01) |
| *H10K 71/00* | (2023.01) |
| *H10K 77/10* | (2023.01) |
| *H01L 31/0224* | (2006.01) |
| *H10K 85/10* | (2023.01) |
| *H10K 85/20* | (2023.01) |
| *H10K 102/00* | (2023.01) |

(52) U.S. Cl.
CPC ......... *H10K 71/861* (2023.02); *H10K 77/111* (2023.02); *B32B 2457/20* (2013.01); *C08J 2305/04* (2013.01); *C08J 2329/04* (2013.01); *C08K 2003/162* (2013.01); *C08K 2003/2237* (2013.01); *C08K 2003/2244* (2013.01); *C08K 2201/001* (2013.01); *C08K 2201/014* (2013.01); *H01L 31/022425* (2013.01); *H10K 85/10* (2023.02); *H10K 85/221* (2023.02); *H10K 2102/311* (2023.02)

(56) References Cited

U.S. PATENT DOCUMENTS

| | | | |
|---|---|---|---|
| 5,760,761 | A | 6/1998 | Sheridon |
| 5,777,782 | A | 7/1998 | Sheridon |
| 5,800,685 | A | 9/1998 | Perrault |
| 5,808,783 | A | 9/1998 | Crowley |
| 6,054,071 | A | 4/2000 | Mikkelsen, Jr. |
| 6,055,091 | A | 4/2000 | Sheridon et al. |
| 6,097,531 | A | 8/2000 | Sheridon |
| 6,128,124 | A | 10/2000 | Silverman |
| 6,137,467 | A | 10/2000 | Sheridon et al. |
| 6,147,791 | A | 11/2000 | Sheridon |
| 6,241,921 | B1 | 6/2001 | Jacobson et al. |
| 6,301,038 | B1 | 10/2001 | Fitzmaurice et al. |
| 6,866,760 | B2 | 3/2005 | Paolini, Jr. et al. |
| 6,870,657 | B1 | 3/2005 | Fitzmaurice et al. |
| 6,922,276 | B2 | 7/2005 | Zhang et al. |
| 6,950,220 | B2 | 9/2005 | Abramson et al. |
| 6,982,178 | B2 | 1/2006 | LeCain et al. |
| 7,002,728 | B2 | 2/2006 | Pullen et al. |
| 7,012,600 | B2 | 3/2006 | Zehner et al. |
| 7,072,095 | B2 | 7/2006 | Liang et al. |
| 7,075,502 | B1 | 7/2006 | Drzaic et al. |
| 7,116,318 | B2 | 10/2006 | Amundson et al. |
| 7,144,942 | B2 | 12/2006 | Zang et al. |
| 7,173,752 | B2 | 2/2007 | Doshi et al. |
| 7,236,291 | B2 | 6/2007 | Kaga et al. |
| 7,312,784 | B2 | 12/2007 | Baucom et al. |
| 7,321,459 | B2 | 1/2008 | Masuda et al. |
| 7,342,068 | B2 | 3/2008 | Klingenberg et al. |
| 7,411,719 | B2 | 8/2008 | Paolini, Jr. et al. |
| 7,420,549 | B2 | 9/2008 | Jacobson et al. |
| 7,453,445 | B2 | 11/2008 | Amundson |
| 7,535,624 | B2 | 5/2009 | Amundson et al. |
| 7,561,324 | B2 | 7/2009 | Duthaler et al. |
| 7,672,040 | B2 | 3/2010 | Sohn et al. |
| 7,679,814 | B2 | 3/2010 | Paolini, Jr. et al. |
| 7,715,088 | B2 | 5/2010 | Liang et al. |
| 7,816,412 | B2 | 10/2010 | Yahiaoui et al. |
| 7,839,564 | B2 | 11/2010 | Whitesides et al. |
| 8,008,461 | B2 | 8/2011 | Pasqua et al. |
| 8,009,348 | B2 | 8/2011 | Zehner et al. |
| 9,279,906 | B2 | 3/2016 | Kang |
| 9,835,925 | B1 | 12/2017 | Bull et al. |
| 10,017,621 | B2 | 7/2018 | Fricke et al. |
| 10,133,104 | B2 | 11/2018 | Yoon et al. |
| 10,444,553 | B2 | 10/2019 | Laxton |
| 2008/0297022 | A1* | 12/2008 | Maruyama ............ B82Y 30/00 313/309 |
| 2009/0208733 | A1* | 8/2009 | Lee ........................ H05B 33/28 445/24 |
| 2013/0149798 | A1* | 6/2013 | Tsuji ................... H01L 27/1225 438/4 |
| 2015/0005720 | A1 | 1/2015 | Zang et al. |
| 2016/0012710 | A1 | 1/2016 | Lu et al. |
| 2016/0141065 | A1* | 5/2016 | Nishizawa ........... A61N 1/0404 156/247 |
| 2017/0351155 | A1 | 12/2017 | Paolini, Jr. et al. |
| 2020/0013980 | A1* | 1/2020 | Zhi ....................... H01G 11/56 |

OTHER PUBLICATIONS

O'Regan, B. et al., "A Low Cost, High-efficiency Solar Cell Based on Dye-sensitized colloidal TiO2 Films", Nature, vol. 353, pp. 737-740 (Oct. 24, 1991).

Bach, Udo et al., "Nanomaterials-Based Electrochromics for Paper-Quality Displays", Adv. Mater, vol. 14, No. 11, pp. 845-848, (Jun. 5, 2002).

Hayes, R.A. et al., "Video-Speed Electronic Paper Based on Electrowetting", Nature, vol. 425, No. 25, pp. 383-385 (Sep. 2003).

Kitamura, T. et al., "Electrical toner movement for electronic paper-like display", Asia Display/IDW '01, pp. 1517-1520, Paper HCS1-1 (2001).

Yamaguchi, Y. et al., "Toner display using insulative particles charged triboelectrically", Asia Display/IDW '01, pp. 1729-1730, Paper AMD4-4 (2001).

Grant, Gregor T. et al., "Biological Interactions between Polysaccharides and Divalent Cations: The Egg-Box Model", FEBS Letters, vol. 32, No. 1, pp. 195-198 (1973).

Morris, Edwin R. et al., "Chiroptical and Stoichiometric Evidence of a specific, primary Dimerisation process in Alginate Gelation", Carbohydrate Research, vol. 66, No. 1, pp. 145-154 (1978).

* cited by examiner

15 μm

20 μm

80 μm

75 μm    90 μm

100 μm
150 μm
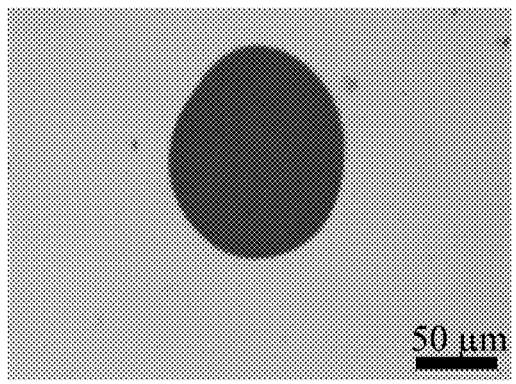
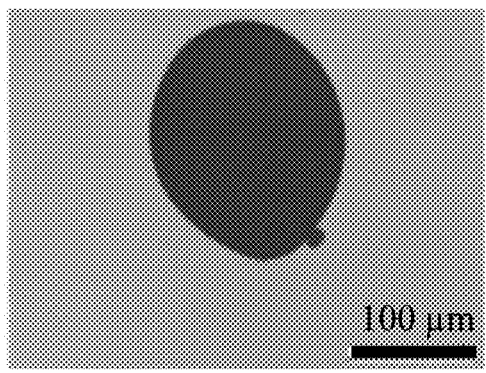
FIG. 14E
FIG. 14F
170 μm
650 μm
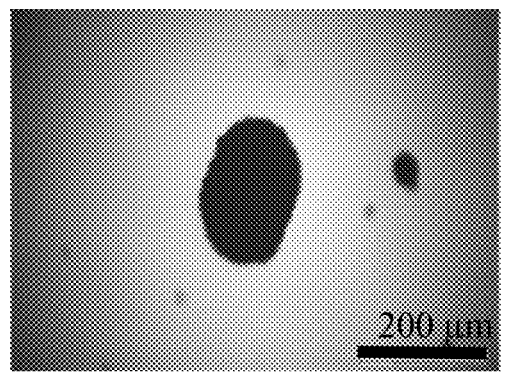
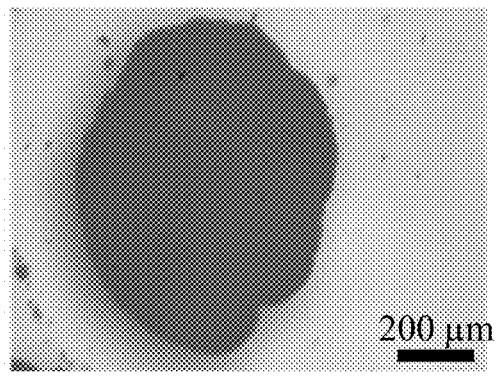
FIG. 14G
FIG. 14H 500 μm

MULTI-LAYER DEVICE INCLUDING A LIGHT-TRANSMISSIVE ELECTRODE LAYER COMPRISING A POROUS MESH OR POROUS SPHERES

RELATED APPLICATIONS

This application claims priority to U.S. Provisional Patent Application No. 63/291,485, filed on Dec. 20, 2021. All patents and publications disclosed herein are incorporated by reference in their entireties.

FIELD OF THE INVENTION

The present invention relates to multi-layer devices comprising electrode layers and a repair layer. The repair layer protects the multi-layer device from electrical short circuits. The repair layer comprises a conductive hydrogel film having conductive filler particles and a cross-linked polymer or conductive hydrogel beads having conductive filler particles and a cross-linked polymer. The invention also relates to a, method of manufacture of such multi-layer devices. The invention also relates to a multi-layer device including a light-transmissive electrode layer comprising a porous mesh or porous spheres, the porous mesh or porous spheres comprising carbon nanotubes or carbon nanowires and a cross-linked polysaccharide. The invention also relates to a multi-layer device including a light-transmissive electrode layer comprising porous spheres, the porous spheres comprising a conductive polymer and a cross-linked polysaccharide.

BACKGROUND OF INVENTION

The term "electro-optic", as applied to a material, a display, or a device, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode layer formed at least in part from a semi-conducting metal oxide and a plurality of dye molecules capable of reversible color change attached to the electrode layer; see, for example O'Regan, B., et al., Nature 1991, 353, 737; and Wood, D., Information Display, 18(3), 24 (March 2002). See also Bach, U., et al., Adv. Mater., 2002, 14(11), 845, Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectricalty", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts institute of Technology (MIT), E Ink Corporation, E ink California, LLC and related companies describe various technologies used in encapsulated and microcell electrophoretic and other electro-optic media. Encapsulated electrophoretic media comprise numerous small capsules, each of which itself comprises an internal phase containing electrophoretically mobile particles in a fluid medium, and a capsule wall surrounding the internal phase. Typically, the capsules are themselves held within a polymeric binder to form a coherent layer positioned between two electrode layers. In a microcell electrophoretic display, the charged particles and the fluid are not encapsulated within microcapsules but instead are retained within a plurality of cavities formed within a carrier medium, typically a polymeric film. The technologies described in these patents and applications include:

(a) Electrophoretic particles, fluids and fluid additives; see for example U.S. Pat. Nos. 7,002,728; 7,679,814;

(b) Capsules, binders and encapsulation processes; see for example U.S. Pat. Nos. 6,922,276; 7,411,719; and U.S. Patent Applications Publication Nos. US2017/0251155;

(c) Microcell structures, wall materials, and methods of forming microcells; see for example U.S. Pat. Nos. 7,072,095; 9,279,906;

(d) Methods for filling and sealing microcells; see for example U.S. Pat. Nos. 7,144,942; 7,715,088;

(e) Films and sub-assemblies containing electro-optic materials; see for example U.S. Pat. Nos. 6,982,178; 7,839,564; and 9,835,925;

(f) Backplanes, adhesive layers and other auxiliary layers and methods used in displays; see for example U.S. Pat. Nos. 7,116,318; 7,535,624; 7,672,040; 7,173,752; 7,342,068; and International Application Publication No. WO 2007/121104;

(g) Color formation and color adjustment; see for example U.S. Pat. Nos. 7,075,502; 7,839,564;

(h) Methods for driving displays; see for example U.S. Pat. Nos. 7,012,600; 7,453,445;

(i) Applications of displays; see for example U.S. Pat. Nos. 7,312,784; 8,009,348; and (j) Non-electrophoretic displays, as described in U.S. Pat. No. 6,241,921; and U.S. Patent Application Publication No. 2015/0277160; and applications of encapsulation and microcell technology other than displays; see for example United States Patent Application Publications Nos. 2015/0005720 and 2016/0012710.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules, even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

Other types of electro-optic materials may also be used in the present invention. Of particular interest, bistable ferroelectric liquid crystal displays (FLC's) are known in the art.

An electro-optic device may typically comprise a plurality of functional layers, including, but not limited to, a front electrode layer, an electro-optic material layer, and a back electrode layer. For example, in some electrophoretic displays, the electro-optic material layer may include a plurality of capsules that arc distributed in a binder. In most such devices, both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

The manufacture of a three-layer electrophoretic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. A very similar process can be used to prepare an electrophoretic display usable with a stylus or similar movable electrode by replacing the backplane with a simple protective layer, such as a plastic film, over which the stylus or other movable electrode can slide. In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically conductive layer; a layer of a solid electro-optic medium in electrical contact with the electrically conductive layer; an adhesive layer; and a release sheet. Typically, the light-transmissive electrically conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 μm), preferably about 2 to about 10 mil (51 to 254 μm). The electrically-conductive layer is conveniently a thin metal or metal oxide layer of, for example, aluminum or ITO, or may be a conductive polymer. Poly(ethylene terephthalate) (PET) films coated with aluminum or To are available commercially, for example as "aluminized Mylar" ("Mylar" is a Registered Trade Mark) from E. I. du Pont de Nemours & Company, Wilmington DE, and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well adapted to mass production since the front plane laminate may be mass-produced, typically using roll-to-roll coating techniques, and then cut into pieces of any size needed for use with specific backplanes.

U.S. Pat. No. 7,561,324 describes a so-called "double release sheet" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a backplane to form the final display, although the order of these two laminations could be reversed if desired.

U.S. Pat. No. 7,839,564 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode layer or front substrate; a second, typically thin layer of adhesive may or may not be present between the electro-optic layer and a backplane. Such electro-optic displays can combine good resolution with good low temperature performance.

The aforementioned 2007/0109219 also describes various methods designed for high volume manufacture of electro-optic displays using inverted front plane laminates; preferred forms of these methods are "multi-up" methods designed to allow lamination of components for a plurality of electro-optic displays at one time.

In the processes described above, the lamination of the substrate carrying the electro-optic layer to the backplane may advantageously be carried out by vacuum lamination. Vacuum lamination is effective in expelling air from between the two materials being laminated, thus avoiding unwanted air bubbles in the final display; such air bubbles may introduce undesirable artifacts in the images produced on the display.

The front electrode layer of a typical electro-optic device may comprise a continuous film of indium Tin Oxide (ITO), which is in electrical contact with the electro-optic material layer. The electro-optic material layer may be formed by coating of an electro-optic material composition onto the front electrode. The invention enables the preservation of good electro-optic performance of an electro-optic device even in the case of coating defects or voids in the electro-optic material layer. Voids, also known as pinholes, may lead to short circuits, because they may cause direct electrical connection between the electrodes.

SUMMARY OF THE INVENTION

Accordingly, in one aspect, this invention provides a multi-layer device comprising a first electrode layer, a repair layer, a functional layer, and a second electrode layer. The functional layer comprises a functional material. The repair layer comprises a conductive hydrogel film or conductive hydrogel beads. The conductive hydrogel film and the conductive hydrogel beads comprise conductive filler particles dispersed in a cross-linked polymer. The conductive hydrogel beads have diameter of from 1 μm to 1 mm. The multi-layer device may further comprise an adhesive layer disposed between the functional layer and the second electrode layer. The conductive filler particles may be selected from the group consisting of carbon black, graphene, carbon nanotubes, carbon nanowires, and mixtures thereof. The first electrode layer and the first repair layer may be integrated in a single layer.

The cross-linked polymer of the repair layer may comprise a polymer selected from the group consisting of a cross-linked polysaccharide, a cross-linked glycerophosphate, a cross-linked acrylate, a cross-linked methacrylate, a cross-linked polyvinyl alcohol, and combinations thereof. The cross-linked polyvinyl alcohol of the repair layer may be formed by a reaction between a polyvinyl alcohol and a titanate or zirconate cross-linking agent. The cross-linked polysaccharide of the repair layer may be formed by a reaction of a cross-linkable polysaccharide and a salt of a divalent metal. The divalent metal of the salt may be selected from the group consisting of calcium, magnesium, strontium, barium, copper, cobalt, nickel, zinc, gallium, and mixtures thereof. The cross-linked polysaccharide of the repair layer may be formed by a reaction of a cross-linkable polysaccharide and a salt of a trivalent metal. The trivalent metal of the salt may be selected from the group consisting of aluminum, iron, and mixtures thereof. The cross-linked polysaccharide may be a cross-linked chitosan and a cross-linked alginate. The cross-linked chitosan and a cross-linked alginate may be formed by a reaction of a chitosan salt or an alginate anion with a salt of a divalent metal, such as calcium. The reaction between the cross-linkable polymer and the cross-linking agent may take place in an aqueous medium.

The conductive hydrogel film of the repair layer of the multi-layer device may be formed by a process comprising the steps: (a) applying a first composition onto the functional layer, forming a first film, (b) applying a second composition onto the first film. The first composition may comprise a cross-linkable polymer and the second composition may comprise conductive filler particles and a cross-linking agent, the cross-linking agent being able to cross-link the cross-linkable polymer. The first composition may comprise a cross-linking agent and conductive filler particles, and the second composition may comprise a cross-linkable polymer, the cross-linking agent being able to cross-link the cross-linkable polymer. The process of forming the conductive hydrogel film may further comprise a step of drying the first film before applying the second composition. The first composition and the second composition may be aqueous.

The conductive hydrogel beads of the repair layer of the multi-layer device may be formed by a process comprising the steps: (a) providing an aqueous composition comprising conductive filler particles and a cross-linkable polymer; and (b) adding an aqueous solution of a cross-linking agent into the aqueous composition comprising the conductive filler particles and the cross-linkable polymer under agitation.

The functional layer of the multi-layer device may be an electro-optic material layer. The electro-optic material layer may comprise a binder and an electrophoretic medium. The electro-optic medium may be encapsulated in microcapsules. The binder may comprise a cross-linked polysaccharide. The electro-optic material layer may comprise liquid crystals. The functional layer may comprise n-type and p-type polymers, or small molecules that can transport electrons and holes, and wherein the multi-layer device is a solar cell or a flexible electronic device. The functional layer may comprise a component selected from the group consisting of an insulator, a capacitor, a resistor, an n-type transistor, a p-type transistor, a polymer, a small molecule, and combinations thereof, that can transport electrons or holes; the multi-layer device may be a flexible organic electronic device or an light emitting diode.

In another aspect, the present invention provides a method of manufacture of a multi-layer device, the method of manufacture comprising the steps (a) providing an assembly comprising a first electrode layer and a functional layer; (b) forming a repair layer on the functional layer; the repair layer comprises a conductive hydrogel film or conductive hydrogel beads; the conductive hydrogel film or the conductive hydrogel beads comprise conductive filler particles dispersed in a cross-linked polymer, the conductive hydrogel beads having diameter of from 1 μm to 1 mm. The conductive filler particles may be selected from the group consisting of carbon black, graphene, carbon nanotubes, carbon nanowires, and mixtures thereof.

The formation of the repair layer may comprise the steps: (a) providing an aqueous dispersion comprising conductive hydrogel beads, wherein the aqueous dispersion is formed by (i) providing an aqueous composition comprising conductive filler particles and a cross-linkable polymer; and (ii) adding an aqueous solution of a cross-linking agent into the aqueous composition under agitation; (b) applying the aqueous dispersion onto the functional layer forming an aqueous layer comprising beads; and (c) drying the aqueous layer comprising beads to form the repair layer. The functional layer is located between the first electrode layer and the repair layer.

In another aspect, the invention provides a method of manufacture of a multi-layer device. The method of manufacture comprises the steps: (a) providing a first assembly comprising a first electrode layer; (b) applying a first composition onto the first electrode layer forming a first film; (c) applying a second composition onto the first film to form a second assembly, the first composition comprising a functional material and a cross-linkable polymer, and the second composition comprising conductive filler particles and a cross-linking agent, or the first composition comprising the functional material, conductive filler particles, and the cross-linking agent, and the second composition comprising the cross-linkable polymer, the cross-linking agent being able to cross-link the cross-linkable polymer; (d) drying the second assembly to form a functional layer comprising the functional material, and a repair layer comprising a conductive hydrogel film having conductive filler particles dispersed in a cross-linked polymer, the functional layer being located between the first electrode layer and the repair layer. The method of manufacture may further comprise a step: drying the first film before applying the second composition. The cross-linkable polymer may comprise a polymer selected from the group consisting of a cross-linkable polysaccharide, a cross-linkable glycerophosphate, a cross-linkable acrylate, a cross-linkable methacrylate, a cross-linkable polyvinyl alcohol, and combinations thereof. The cross-linkable polymer may be a cross-linkable polyvinyl alcohol and the cross-linking agent may be a titanate or zirconate. The cross-linkable polymer may be a polysaccharide and the cross-linking agent may be a divalent or trivalent metal salt. The divalent metal salt may be selected from the group consisting of a calcium salt, a magnesium salt, a strontium salt, a barium salt, a cupric salt, a cobalt salt, a nickel salt, a zinc salt, a gallium salt, and mixtures thereof. The trivalent metal salt may be selected from the group consisting of an aluminum salt, a ferric salt, and mixtures thereof. The cross-linkable polysaccharide may be a chitosan or an alginate. The cross-linkable polymer may be chitosan or an alginate and the cross-linking agent may be a divalent metal, such as calcium.

In another aspect, the invention provides a method of manufacture of a multi-layer device. The method of manufacture comprises the steps: (a) providing a first assembly comprising a first electrode layer; (b) applying a first composition onto the first electrode layer forming a first film, the first composition comprising a functional material and a cross-linkable polymer; (c) applying a second composition onto the first film to form a second assembly, the second composition comprising conductive filler particles and a cross-linking agent; (d) drying the second assembly to form a functional layer comprising a functional layer, a repair layer comprising a conductive hydrogel film having conductive filler particles dispersed in a cross-linked polymer, and a second electrode layer, the functional layer being located between the first electrode layer and the repair layer, and the repair layer being disposed between the functional layer and the second electrode layer. The method of manufacture may also comprise: connecting or transferring a second electrode layer to the polymer layer.

In another aspect, the invention provides a method of manufacture of a multi-layer device. The method of manufacture comprises the steps: (a) providing a first assembly comprising a first electrode layer; (b) applying a first composition onto the first electrode layer forming a first film, the first composition comprising a functional material, a cross-linking agent and conductive filler particles; (c) applying a second composition onto the first film to form a second assembly, the second composition comprising a cross-linkable polymer; (d) drying the second assembly to form a functional layer comprising the functional material, a repair layer, and a polymer layer, the functional layer being disposed between the repair layer and the polymer layer, the repair layer comprising a conductive hydrogel film having conductive filler particles dispersed in a cross-linked polymer, and the polymer layer comprising the cross-linked polymer.

The present invention is related to a multi-layer device including a light-transmissive electrode layer, the light-transmissive electrode layer comprising a porous mesh or porous spheres, the porous mesh or porous spheres comprising carbon nanotubes or carbon nanowires and a cross-linked polysaccharide. The cross-linked polysaccharide is formed by a reaction of a cross-linkable polysaccharide and a cross-linking agent. The divalent metal or the trivalent metal is selected from the group consisting of calcium, magnesium, strontium, barium, zinc, copper, cobalt, nickel, gallium, aluminum, iron, and mixtures thereof. The cross-linked polysaccharide is selected from the group consisting of a cross-linked chitosan, a cross-linked alginate, and mixtures thereof. The cross-linked chitosan and the cross-linked alginate may be formed by a reaction between a chitosan anion or an alginate anion with a calcium salt. The multi-layer device may further comprise a functional layer. The functional layer may be an electro-optic material layer, comprising a binder and an electrophoretic medium. The functional layer may comprise liquid crystals. The functional layer may comprise n-type and p-type polymers, or small molecules that can transport electrons and holes, and wherein the multi-layer device is a solar cell or a flexible electronic device. The functional layer may comprise a component selected from the group consisting of an insulator, a capacitor, a resistor, an n-type transistor, a p-type transistor, a polymer, a small molecule, and combinations thereof, that can transport electrons or holes, and wherein the multi-layer device is a flexible organic electronic device or an light emitting diode.

The porous mesh of the light-transmissive electrode layer may be formed by a fast addition of an aerated aqueous mixture of a polysaccharide: anion and carbon nanotubes or carbon nanowires into an aqueous solution of a salt of a divalent or trivalent metal. The polysaccharide may be an alginate and the divalent or trivalent metal is calcium.

The porous spheres of the light-transmissive electrode may be formed by a slow addition of an aerated aqueous mixture of a polysaccharide anion and carbon nanotubes or carbon nanowires into an aqueous solution of a salt of a divalent or trivalent metal. The polysaccharide may be an alginate and the divalent or trivalent metal may be calcium.

The present invention is related to a multi-layer device including a light-transmissive electrode layer, the light-transmissive electrode layer comprising porous spheres, the porous spheres comprising a conductive polymer and a cross-linked polysaccharide. The cross-linked polysaccharide may be formed by a reaction of a cross-linkable polysaccharide and a cross-linking agent. The cross-linking agent may be a salt of a divalent metal or a salt of a trivalent metal. The cross-linked polysaccharide may be selected from the group consisting of a cross-linked chitosan, a cross-linked alginate, and mixtures thereof. The cross-linked chitosan and the cross-linked alginate may be formed by a reaction between a chitosan anion or an alginate anion with a calcium salt.

BRIEF DESCRIPTION OF THE DRAWINGS

FIGS. 14A-14H shows microphotographs of conductive hydrogel beads of various diameters;

DETAILED DESCRIPTION

Figure 1:
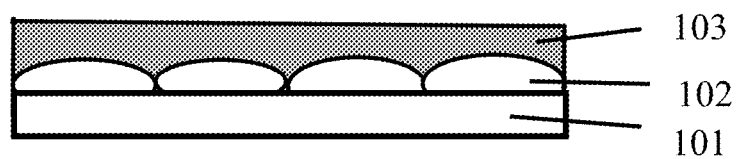
FIG. 1 illustrates a side view of a prior art example of a multi-layer device comprising a functional layer disposed between two electrode layers.

As used herein, the term "conductive" is synonymous to "electrically-conductive" and not necessarily to other types of conductivity, such as thermally conductive or magnetically conductive, etc., unless otherwise stated. "Conductive filler particles" are particles that, when included in a layer of a multi-layer device, increase the electrical conductivity of said layer.

As used herein, "molecular weight" refers to weight average molecular weight, unless otherwise stated. Molecular weight is measured using industry standard size exclusion column chromatography.

"Hydrogel" is a structure comprising a cross-linked hydrophilic polymer that is not soluble is water and that maintains a well-define structure.

Multi-layer devices are devices that comprise at least three layers. Typically, the layers of a multi-layer device form a stack. The term "laminate" may be also used for such devices.

Liquid crystal display (LCD) is a device that utilizes the electro-optical characteristics of liquid crystals to convert an electrical stimulus into a visual signal, forming variable images. LCDs comprise a liquid crystal layer comprising liquid crystal materials. The orientation of such crystals can be changed via the application of electric currents.

"Functional layer" of a device is a layer of a multi-layer device that contributes to the proper operation of the device. For example, liquid crystal layer is a functional layer for LCDs. LCDs and electrophoretic displays (EPI)) are electro-optic devices both having electro-optic material layers (such as the liquid crystal layer for and LCD). Typically, the electro-optic material layer for EPDs comprises encapsulated electrophoretic medium. The electrophoretic medium comprises charge particles in a non-polar fluid. Multi-layer devices may comprises more than one functional layers providing more than one functions.

"Slow addition" of a solution or a dispersion into another solution or dispersion means that the addition takes place in 3 minutes or more. Another synonymous term that can be used is "dropwise addition".

"Fast addition" of a solution or a dispersion into another solution or dispersion means that the addition takes place in less than 3 minutes.

The term "porous mesh", as used herein, is a porous structure that comprises a conductive material, the conductive material being in a form of a mesh. The porous mesh structure may be formed from a wet porous mesh structure after drying. The porous mesh structure may be used as an electrode layer in a multi-layer device. The electrode layer may be light-transmissive.

The term "porous spheres", as used herein, is a porous structure that comprises spheres. The spheres comprise a conductive material and cross-linked polysaccharide. The porous spheres may be formed by dropwise addition of an aerated dispersion of conductive filler particles and a polymer solution into a solution of a cross-linking agent. The structure of porous spheres may be used as an electrode layer in a multi-layer device. The electrode layer may be light-transmissive.

The term "conductive polymer spheres", as used herein, is a structure that comprises conductive polymer and cross-linked polymer. The structure may be formed by dropwise addition of a dispersion of conductive polymer and a polymer into a solution of a cross-linking agent. The structure of conductive polymer spheres may be used as an electrode layer in a multi-layer device. The electrode layer may be light-transmissive.

The term "light-transmissive electrode layer", as used herein, is an electrode layer of a multi-layer device that transmits sufficient light to enable an observer, looking through that electrode layer, to observe the image or color that is present in layer A, wherein the electrode layer is located between the observer and layer A. Specifically, a light-transmissive electrode layer transmits 60 percent or more of the incident visible light. The term "transparent electrode layer" is synonymous to the term "light-transmissive electrode layer".

The term "assembly", as used herein, refers to a device or part of a device, which is involved in the process of manufacture of a multi-layer device. That is, the term includes an intermediate form that is used, or produced, during the process of manufacture of the multi-layer device.

The term "application" of a composition on a layer or a film, as used herein, may include a variety of methods including printing and coating. In the present invention, compositions are applied on specific layers or films via coating or other techniques. For example, a first composition and a second composition are sequentially applied on a functional layer to form a repair layer. The application of the first composition and the second composition may be performed by various processes including such as printing and coating. Non-limiting examples of such methods include pre-metered coatings (such as patch die coating, slot or extrusion coating, slide or cascade coating, curtain coating), roll coating (such as knife over roll coating, forward and reverse roll coating), gravure coating, dip coating, spray coating, meniscus coating, spin coating, brush coating, air knife coating, silk screen printing, electrostatic printing, thermal printing, ink jest printing, electrophoretic deposition, and other.

Figure 2:
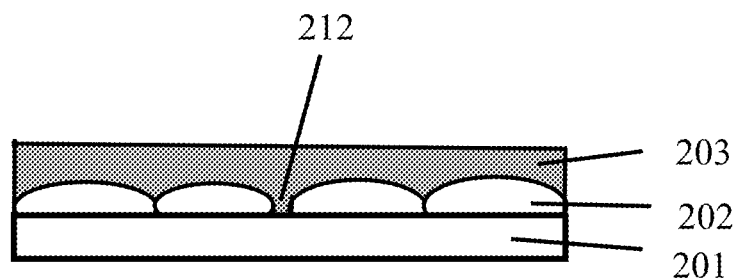
FIG. 2 illustrates a side view of a prior art example of a multi-layer device comprising a functional layer disposed between two electrode layers, wherein the functional area contains a pinhole.

In one aspect, the present invention provides a multi-layer device that comprises a first electrode layer, a repair layer, a functional layer, and a second electrode layer. The repair layer comprises a conductive hydrogel film or conductive hydrogel beads and prevents electrical short circuits of the device. Such electrical short circuits take place if there is a direct electrical connection between the two electrode layers of the device that sandwich the functional layer. For example, FIG. 1 illustrates multi-layer device 100 comprising first electrode layer 101, functional layer 102 and a second electrode layer 103. Shorts circuits are not common in such devices unless there is a pinhole in the functional layer, as shown in FIG. 2. FIG. 2. illustrates a multi-layer 200 that comprises first electrode layer 201, functional layer 202 and a second electrode layer 203. In this case, there is pinhole 212 in functional layer 202, which increases the probability of short circuits, because the first electrode layer and the second electrode layer may become directly electrically connected. The multi-layer device of the present invention comprises a repair layer that prevents short circuits.

Figure 3:
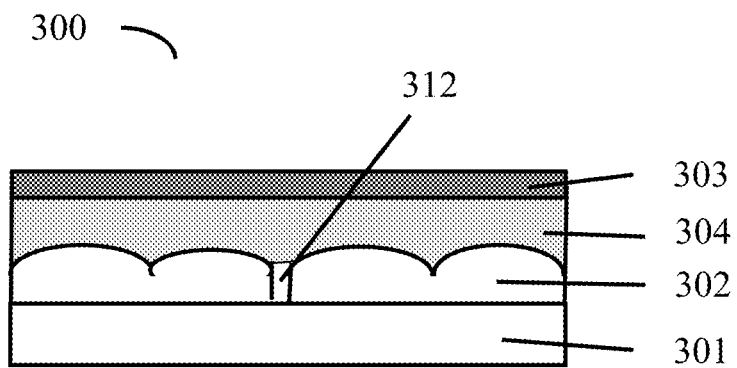
FIG. 3 illustrates a side view of an example of a multi-layer device comprising a functional layer disposed between two electrode layers, wherein the functional area contains a pinhole, and wherein the device comprises a repair layer having a conductive hydrogel film.

FIG. 3 illustrates an example of inventive device. Multi-layer device 300 comprises first electrode layer 301, repair layer 304, functional layer 302 having pinhole 312, and second electrode layer 303. Repair layer 304 comprises a conductive hydrogel film. Repair layer 304 prevents direct connection between electrode layers 301 and 303. Thus, it prevents electrical short, circuits.

Figure 4:
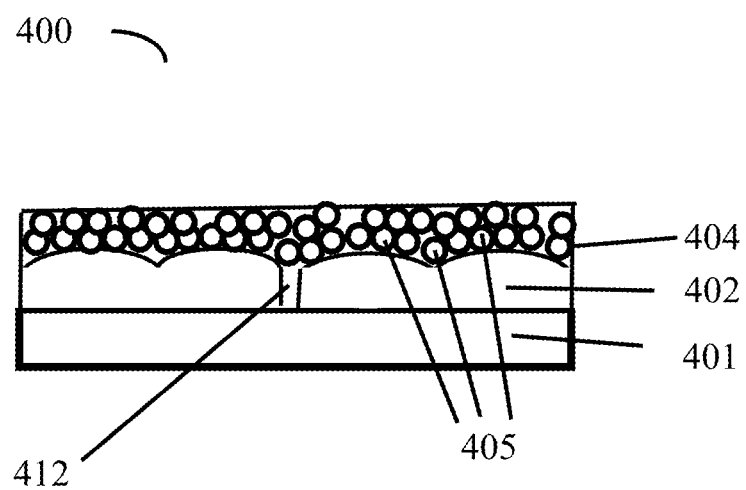
FIG. 4 illustrates a side view of an example of a multi-layer device comprising a functional layer disposed between two electrode layers, wherein the functional area contains a pinhole, and wherein the device comprises a repair layer having conductive hydrogel beads.

FIG. 4 illustrates another example of inventive device 400. Multi-layer device 400 comprises first electrode layer 401, repair layer 404, functional layer 402 having pinhole 412, and second electrode layer 403. Repair layer 404 comprises conductive hydrogel beads 405. Repair layer 404 prevents direct connection between electrode layers 401 and 403 and prevents electrical short circuits. In this device, the repair layer may also serve as a second electrode layer. The conductive hydrogen beads may have sufficient conductivity so that the layer formed by the conductive hydrogel beads is the repair layer and the second electrode layer. Preferably, effective repair layers are formed when the diameter of the conductive hydrogel beads is larger than the diameter of the potential pinhole of the functional layer.

Figure 5:
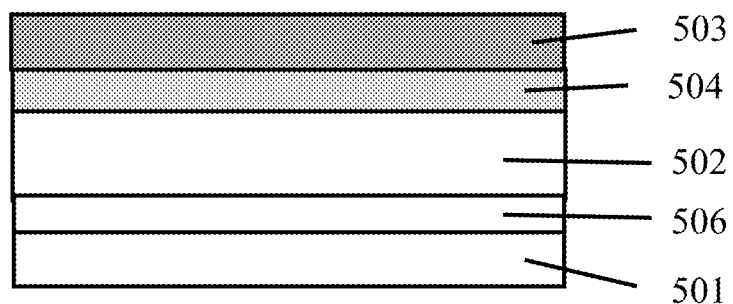
FIG. 5 illustrates a side view of an example of a multi-layer device comprising a first electrode layer, a first repair laver, a functional layer, an adhesive layer, and a second electrode layer.

Multi-layer devices of the present invention may further comprise an adhesive layer between a functional layer and an electrode layer. FIG. 5 illustrates multi-layer device 500 comprising first electrode layer 501, adhesive layer 506, functional layer 502, repair layer 504, and second electrode layer 503. Repair layer 504 comprises conductive hydrogel film or conductive hydrogel beads. If the repair layer comprises conductive beads, the repair layer may serve to prevent short circuits and it may serve as second electrode layer.

Figure 6:
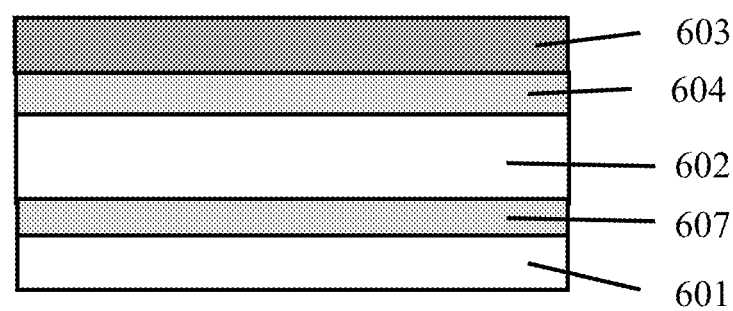
FIG. 6 illustrates a side view of an example of a multi-layer device comprising a first electrode layer, a first repair layer, a functional layer, a second repair layer, and a second electrode layer.

Multi-layer devices of the present invention may further comprise more than one repair layer. FIG. 6 illustrates multi-layer device 600 comprising first electrode layer 601, second repair layer 607, functional layer 602, first repair layer 604, and second electrode layer 603. Repair layers 604 and 607 may comprise conductive hydrogel film or conductive hydrogel beads. Second repair layer 607 may be formed from the same material and/or processes as those of first repair layer 604 or it may be formed from different material and/or processes as those of the first repair layer 604. As mentioned above, if the first repair layer comprises conductive hydrogel beads of sufficient conductivity, the first repair layer may also serve as the second electrode layer. That is, the first repair layer and the second electrode layer may be integrated in a single layer. Analogously, if the second repair layers comprises conductive hydrogel beads of sufficient conductivity, the second repair layer may also serve as first electrode layer. That is, the second repair layer and the first electrode layer may be integrated in a single layer.

Figure 7:
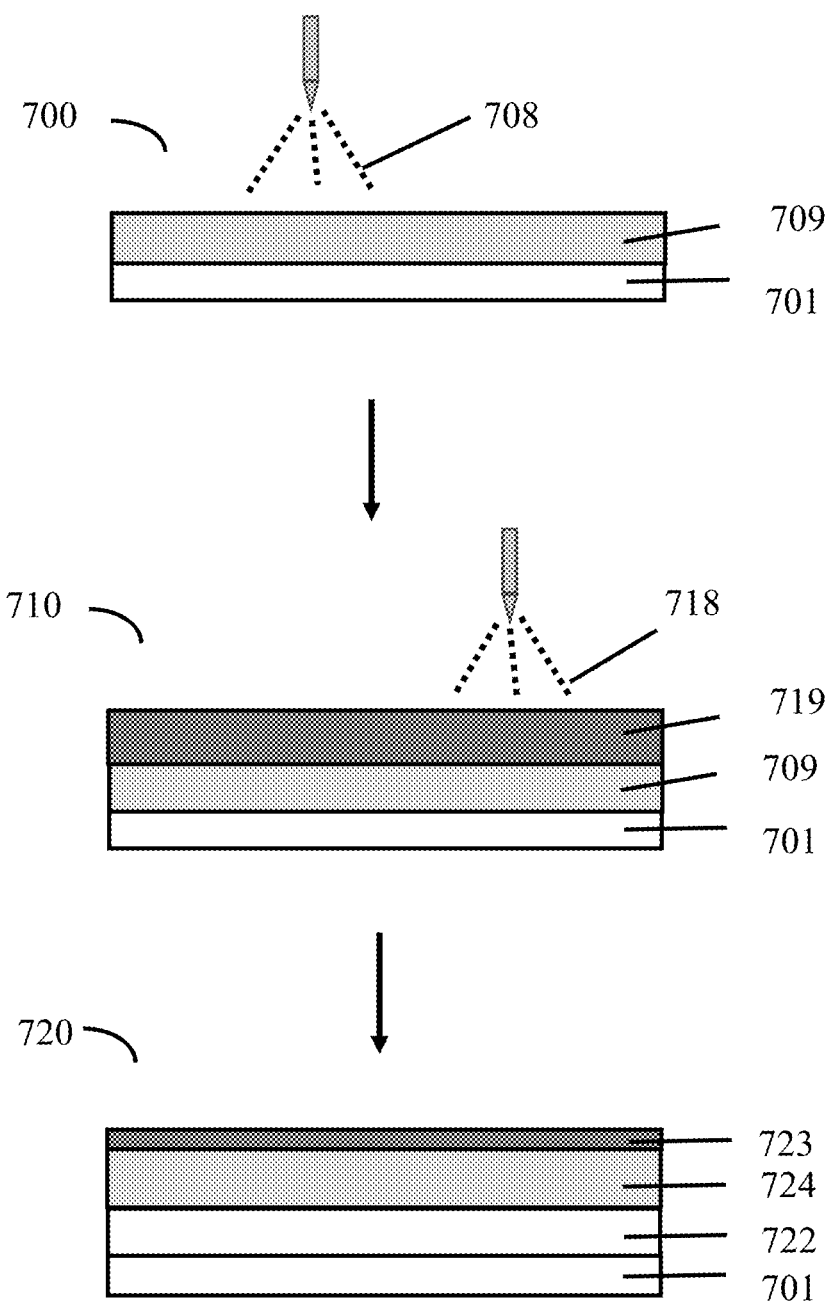
FIG. 7 illustrates an example of a method of manufacture of a multi-layer device comprising a repair layer.

In one aspect, the present invention provides a method of manufacture of multi-layer device that comprises a first electrode layer, a functional layer, a repair layer, and a second electrode layer. The repair layer may comprises a conductive hydrogel film that comprises conductive filler particles and a cross-linked polymer. An example of a process of manufacture of the multi-layer device is illustrated in FIG. 7. In the first step, first composition 708 is applied onto a surface of first electrode layer 701 to form first film 709 of assembly 700. First composition 708 may comprise functional material and a cross-linkable polymer in an aqueous carrier. Second composition 718 is then applied onto first film 709 to form film 719 of assembly 710. Second composition 718 may comprise conductive filler particles and a cross-linking agent that can cross-link the cross-linkable polymer of first composition 708. Second composition 718 may comprise a solution of the cross-linking agent in an aqueous carrier, Second composition 718 may be applied onto first film 709 without drying first film 709. Alternatively, second composition 718 may be applied onto first film 709 after drying first film 709 or after partial drying first film 709.

As mentioned above, a variety of methods may be used for performing the application of the first and second compositions. In FIG. 7, spray coating is illustrated.

The contacting of first film 709 with film 719 and subsequent drying of films 709 and 719 results in multi-layer device 720. Device 720 comprises first electrode layer 701, functional layer 722, repair layer 724, and second electrode layer 723. Specifically, the contacting of first film 709 with film 719 and subsequent drying results in the formation of three different layers 722, 724, and 723. Functional layer 722 is formed adjacent to first electrode layer 701 by the functional material of first film 709 (formed by first composition 708). Repair layer 724, comprising a conductive hydrogel film, is formed by a reaction of the cross-linkable polymer of first film 709 and the cross-linking agent of film 719 (formed by second composition 718). Second electrode layer 723 is formed by the conductive filler particles of film 719. Thus, the sequential application of first composition 708 and second composition 718 leads to the formation of three layers of the device, functional layer 722, repair layer 724, and second electrode layer 723, after drying.

Figure 8:
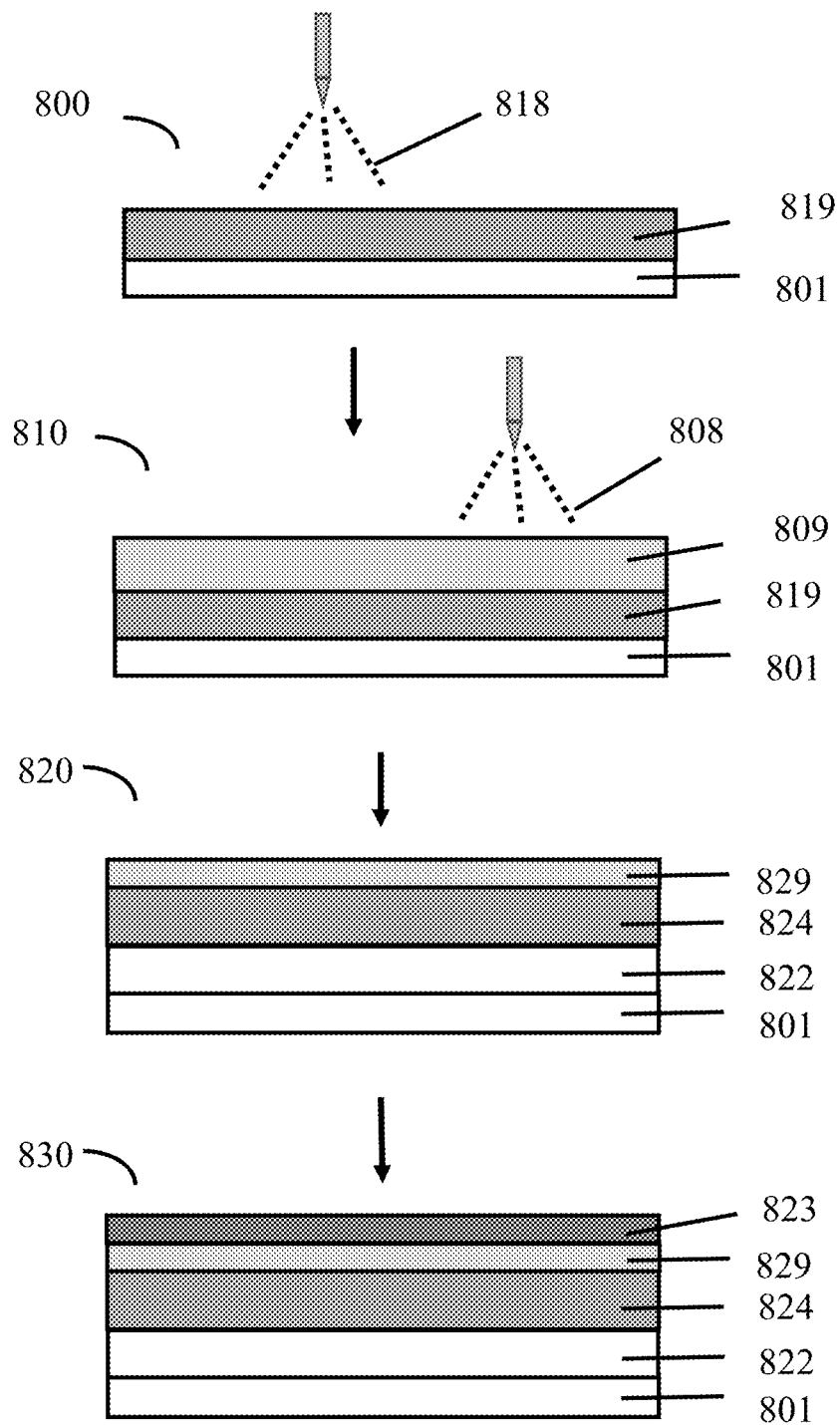
FIG. 8 illustrates another example of a method of manufacture of a multi-layer device comprising a repair layer.

In one aspect, the present invention provides a method of manufacture of multi-layer device that comprises a first electrode layer, a functional layer, a repair layer, and a second electrode layer. The repair layer comprises a conductive hydrogel film. An example of a process of manufacture of the multi-layer device is illustrated in FIG. 8. In the first step, a first composition 818 is applied onto a surface of first electrode layer 801 to form first film 819 of assembly 800. First composition 818 may comprise functional material, conductive filler particles, and a cross-linking agent in a carrier, such as an aqueous carrier. Second composition 808 is applied onto first film 819 to form film 809 of assembly 810. Second composition 808 may comprise a cross-linkable polymer that can be cross-linked by the cross-linking agent of first composition 818. Second composition 808 may be a solution of the cross-linkable polymer in an aqueous carrier. Second composition 808 may be applied onto first film 819 without drying first film 819 or after drying first film 819 or after partial drying first film 819.

As mentioned above, a variety of methods may be used for performing the application of the first and second compositions. In FIG. 8, spray coating is illustrated.

The contacting of first film 819 with film 809 and subsequent drying results in multi-layer device 820 comprising first electrode layer 801, functional layer 822, repair layer 824, and a polymer layer 829. Specifically, the contacting of first film 819 with film 809 and subsequent drying results in the formation of three different layers 822, 824, and 829. Functional layer 822 is formed adjacent to first electrode layer 801 by the functional material of first film 819 (formed by first composition 818). Repair layer 824, comprising a conductive hydrogel film, is formed by a reaction of the cross-linkable polymer of second film 809 (formed by the second composition 808) and the cross-linking agent of film 809 (formed by first composition 818), Polymer layer 829 is formed by the drying of film 809 and comprises cross-linkable polymer. Thus, the sequential application of first film 819 and film 809 leads to the formation of three layers of assembly 820, functional layer 822, repair layer 8724, and polymer layer 829. A second electrode layer 823 may be formed on the surface of polymer layer 829 by transferring or coating of a second electrode layer to provide device 830 comprising first electrode layer 801, functional layer 822, repair layer 824, polymer layer 829, and second electrode layer 823.

Figure 9:
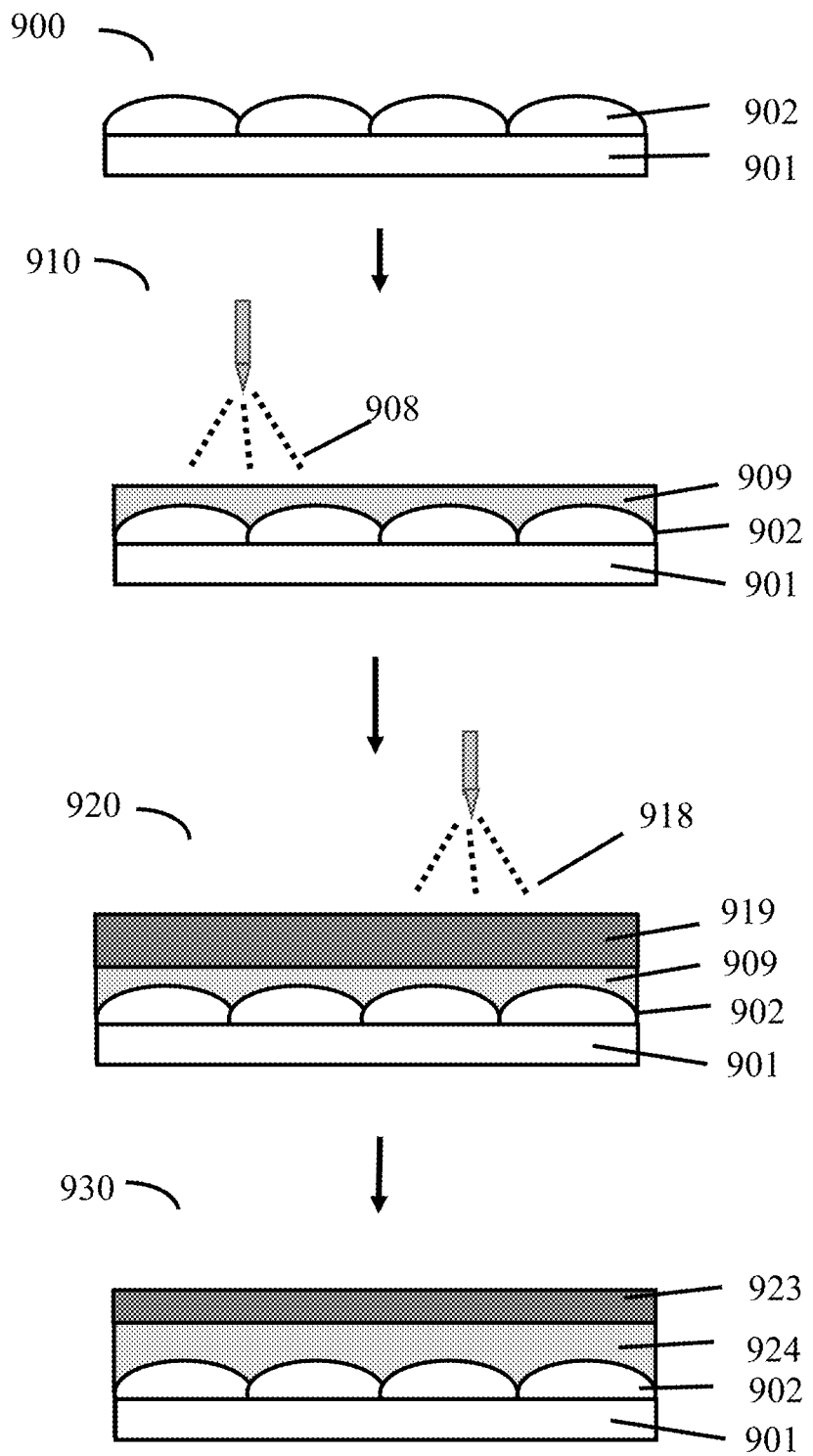
FIG. 9 illustrates yet another example of a method of manufacture of a multi-layer device comprising a repair layer.

In another aspect, the present invention provides a method of manufacture of multi-layer device that comprises a first electrode layer, a functional layer, a repair layer, and a second electrode layer. The repair layer comprises a conductive hydrogel film, An example of a process of manufacture of the multi-layer device is illustrated in FIG. 9. The process involves assembly 900 comprising first electrode layer 901 and functional layer 902. First composition 908 is applied on a surface of functional layer 902 via spray coating, forming first film 909 of assembly 910. First composition 908 comprises a cross-linkable polymer. Second composition 918 is applied on first film 909 to form film 919 of assembly 920. Second composition 918 comprises conductive filler particles and a cross-linking agent in a carrier. The cross-linking agent can cross-link the cross-linkable polymer of first film 909. The carrier may be an aqueous carrier. Second composition 918 may be an aqueous dispersion of conductive filler particles, further comprising the cross-linking agent dissolved in the aqueous carrier. Second composition 918 may be applied onto first film 909 without drying first film 909, after drying first film 909, or after partial drying of first film 909.

As mentioned above, a variety of methods may be used for performing the application of the first and second compositions. In FIG. 9, spray coating is illustrated.

The contacting of first film 909 with film 919 and subsequent drying results in multi-layer device 930 comprising first electrode layer 901, functional layer 902, repair layer 924, and second electrode layer 923. Specifically, the contacting of first film 909 with film 919 and subsequent drying results in the formation of two new layers 924, and 823. Repair layer 924, comprising a conductive hydrogel film, is formed by a reaction of the cross-linkable polymer of first film 909 (formed by first composition 908) and the cross-linking agent of film 919 (formed by second composition 918). Second electrode layer 923 is formed by the drying of film 919, which may comprise conductive filler particles.

Figure 10:
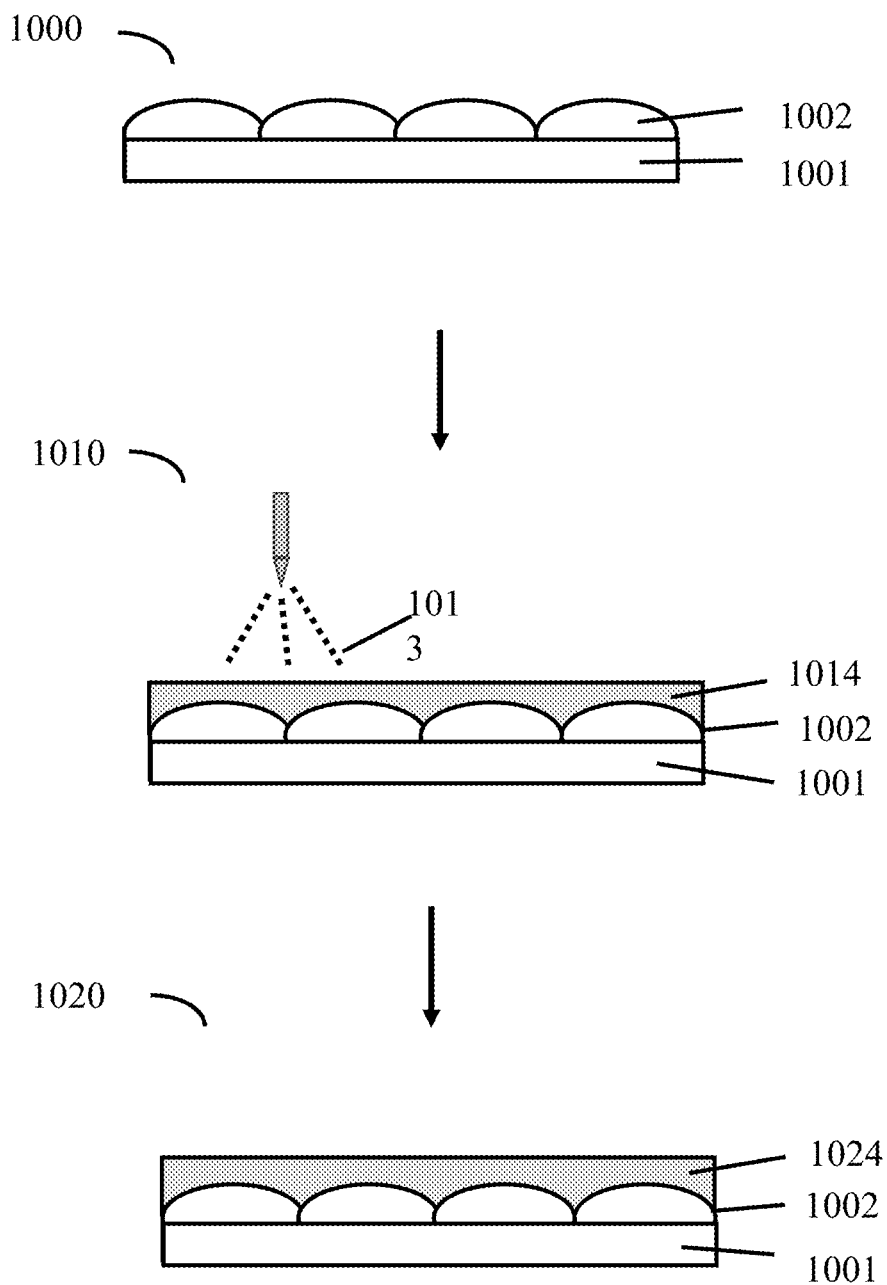
FIG. 10 illustrates another example of a method of manufacture of a multi-layer device comprising a repair layer.

In another aspect, the present invention provides a method of manufacture of multi-layer device that comprises a first electrode layer, a functional layer, and a repair layer. The repair layer comprises conductive hydrogel beads. An example of a process of manufacture of the multi-layer device is illustrated in FIG. 10. The process involves assembly 1000 comprising first electrode layer 1001 and functional layer 1002. Aqueous dispersion 1013 comprising conductive hydrogel beads is applied on a surface of functional layer 1002 via spray coating, forming first aqueous film 1014 of assembly 1010. The beads are not shown in the drawings of FIG. 10. Drying of first aqueous film 1024 results in repair layer 1024 of device 1020. In device 1020, repair layer 1024 may also serve as second electrode layer. The conductive hydrogen beads may have sufficient conductivity so that layer 1024 formed by the conductive hydrogel beads is the repair layer and the second electrode layer.

As mentioned above, a variety of methods may be used for performing the application of aqueous dispersion 1013. In FIG. 10, spray coating is illustrated. Coating aqueous dispersion 1013 and drying of the resulting aqueous film 1014 results in multi-layer device 1020 comprising first electrode layer 1001, functional layer 1002, and repair layer 1024, wherein repair layer 1024 may also serve as the second electrode layer of device 1020.

The cross-linkable polymer may be a polymer that can be cross-linked using a cross-linking agent that forms a hydrogel. Non-limiting examples of cross-linkable polymers include polysaccharides, polyacrylates, polymethacrylates, phosphates, peptides, proteins, and other polymers. The polysaccharide may be an alginate, a substituted alginate, a chitosan, and a substituted chitosan. The chitosan may be (N-[(2-hydroxy-3-trimethylammonium) propyl] chitosan chloride. The phosphate may be a glycerophosphate. The polyacrylate and polymethacrylate may be polyacrylic acid, methacrylic acid, dimethylaminoethyl methacrylate.

The cross-linkable polymer may anionic or cationic. The anionic polymers may be cross-linked by a cationic cross-lining agent, such as a divalent metal cation (strontium, magnesium, calcium, strontium, barium, zinc, copper). The anionic polymers may be cross-linked by a cationic cross-lining agent, such as a trivalent metal cation (iron, aluminum). The cationic polymers may be cross-linked by an anionic cross-linking agent. Anionic and cationic polymers may also be cross-linked by adjustment of the pH.

Another approach for the preparation of cross-linked polymer of the hydrogel of the present invention is the methodology of "ionic-complementarity". It uses a peptide of alternating positive and negative charge distribution leading to peptide self-assembly. These peptides assume β-sheet secondary structure predominantly, and can form hydrogels. The advantage of this approach is that nanoscopic and/or macroscopic structures with great stability and functionality can be developed by varying peptide concentration, pH, presence of salts, and time.

Figure 11:
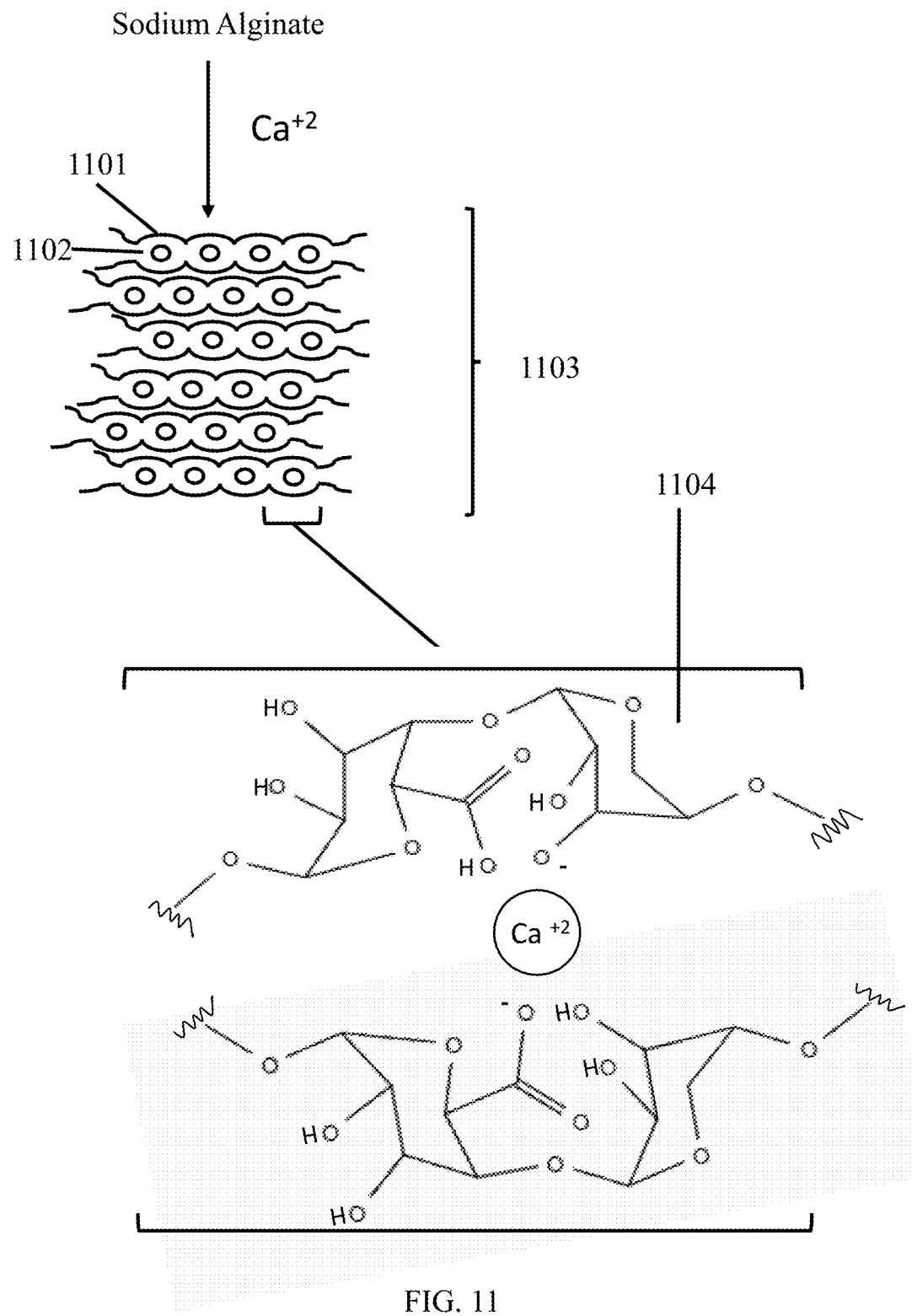
FIG. 11 illustrates a summary of an example of the preparation of a hydrogel comprising cross-linked alginate; it also shows a proposed chemical structure of the hydrogel.

Anionic polysaccharides can be cross-linked with polyvalent metal cations. For example, sodium alginate or potassium alginate may be cross-linked with cations of alkali earth metals, such as calcium cation. Sodium alginate is a biodegradable hydrophilic polysaccharide isolated from algae. It has a backbone of linked β-d-mannuronic acid (M units) and α-1-guluronic acid (G units). In the presence of calcium cations the G-blocks of alginate participates in intermolecular cross-linking with the divalent atom following "egg box" model, as shown in FIG. 11. The "egg box model" has been initially proposed by Morris et al. (Grant, G. T.; Morris, E. R.; Rees, D. A.; and Smith, P. J. C.; Thom, D. *FEBS Lett.* 1973, 32, 195; Morris, E. R.; Rees, D. A.; Thom, D.; Boyd, J. *Carhohydr. Res.* 1978, 66, 145). Calcium ions 1102 interact with the carboxylate ion of the alginate as well as other oxygen atoms of the groups of alginate 1101, forming cross-linked polymers 1104, which form hydrogel 1103. During the preparation of the cross-linked polymer, calcium ions replaces sodium ions of the polymer forming an instant hydrogel as depicted in FIG. 11. Each calcium ion can attach to two of the polymer strands and cross-links to form a polymer mesh. In the presence of conductive filler particles, the formation of hydrogel locks the movement of carbon particles in the cross-linked polymer structure.

Examples of synthesis of preparation of hydrogel films in an aqueous carrier are disclosed in the Examples section of this application. The presence of conductive filler particles in the cross-linking agent solution may be used to control the conductivity of the resulting hydrogel film or hydrogel beads. In an example of the preparation of conductive hydrogel films, an aqueous solution or dispersion of cross-linkable polymer is applied on a surface to form a first film, followed by an application of an aqueous dispersion of conductive filler particles (i.e. conductive carbon black) comprising a cross-linking agent, followed by drying of the films. The application of the cross-linking agent may be done before the drying of the first film, after the drying of the first film, or after partial drying of the first film. In the case of an electro-optic device, the aqueous solution of dispersion of the cross-linkable polymer may also comprise a functional material, such, for example, capsules comprising an electrophoretic medium. The electrophoretic medium may comprise charge pigment particles in a non-polar fluid. A polymer binder may also be present in the aqueous solution of the cross-linkable polymer.

Figure 12:
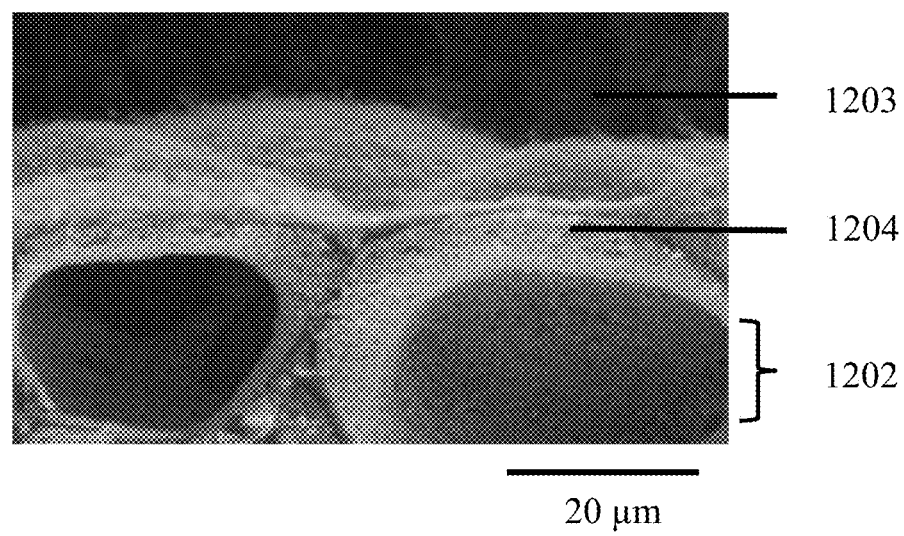
FIG. 12 shows an microphotograph of a conductive hydrogel film formed from the reaction of alginate and calcium chloride.

FIG. 12 is a microphotograph of a hydrogel film that is formed by the process that is described in Example 6. The process is summarized as follows. An aqueous sodium alginate solution comprising electrophoretic capsules (from Example 3 below) was spray coated on a surface of a first electrode layer forming a first film, followed by spray coating of an aqueous dispersion comprising conductive carbon black and calcium chloride (from Example 4 below). The microphotograph is a cross-sectional view of the dried film. The microphotograph shows (a) the functional layer comprising capsules 1202, (b) repair layer 1204 comprising hydrogel film, and (c) conductive layer 1203, which can serve as second electrode layer, comprising conductive carbon black particles. Layer 1203 may also comprise unreacted calcium chloride, which may be removed by washing the second electrode layer with deionized water. Repair layer 1204 comprises cross-linked polymer (calcium alginate).

The cross-linking reaction takes place rapidly after the application of the second aqueous dispersion. Thus, the capsules of functional layer 1202 and the conductive filler particles of electrode layer 1203 are locked at their location and do not have the ability to move freely. If there are pinholes in functional layer 1202, there are filled with cross-linked alginate via the reaction of sodium alginate and calcium cations. This prevents conductive carbon particles to move towards the first electrode layer. In other words, the rapid cross-linking reaction does not allow sufficient time for the conductive filler particles to diffuse towards the first electrode layer. Thus, the process summarized above forms functional layer 1202 that is free of pinholes and not vulnerable to short circuit problems.

Figure 13:
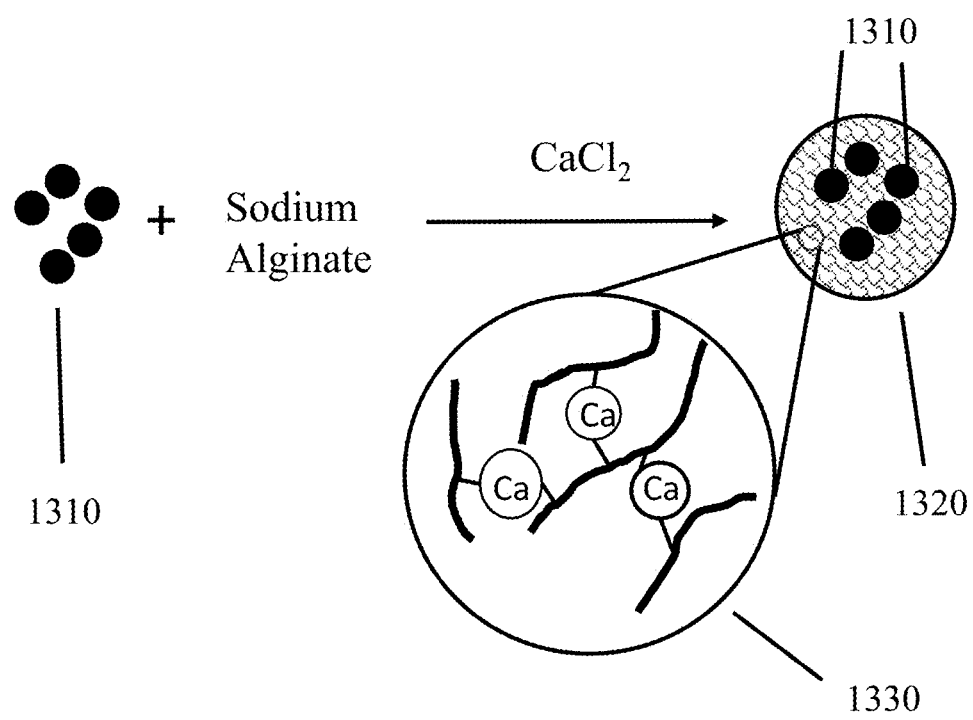
FIG. 13 illustrates the reaction scheme of the preparation of conductive hydrogel beads that can be used in a repair layer for multi-layer devices.
Figure 14A:
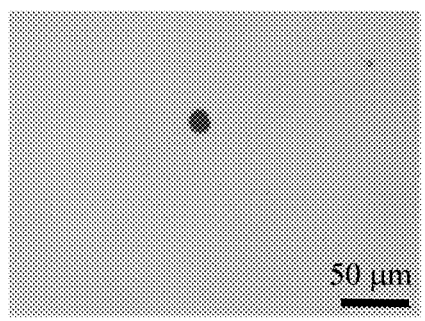
Figure 14B:
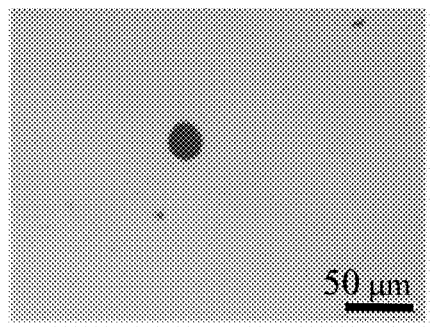
Figure 14C:
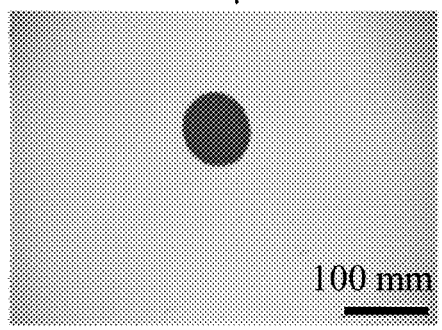
Figure 14D:
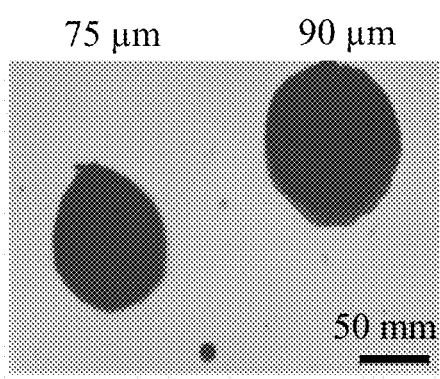

An example of the preparation of conductive hydrogel beads in an aqueous carrier is disclosed in the Examples section of this application. A repair layer, which comprises conductive hydrogel beads, located adjacent to a functional layer of a multi-layer device as shown in FIG. 4, prevents short-circuits. Specifically, conductive hydrogel beads that have diameter larger than potential pinholes of the functional layer prevent the electrical connection of the electrodes through the functional layer. Furthermore, if the conductivity of the conductive hydrogel beads is sufficiently high and the layer of the conductive beads is continuous, the repair layer can also serve as an electrode layer. The conductive hydrogel beads may comprise a cross-linked polymer and conductive filler particles. For example, the conductive hydrogel beads may comprise calcium alginate and carbon black particles. Such conductive hydrogel beads may be prepared in an aqueous carrier by the mixing of (a) an aqueous dispersion of conductive beads having also a sodium alginate dissolved in the aqueous carrier and (b) an aqueous solution of calcium chloride. A summary of this reaction scheme is illustrated in FIG. 13. The conductive hydrogel beads comprise carbon black particles 1310 and cross-linked alginate (calcium alginate) 1330.

Under certain conditions, structures that are useful as light-transmissive electrode layers can be prepared by cross-linking of polysaccharides in the presence of carbon nanowires or carbon nanotubes. The light-transmissive electrode layers comprise a porous mesh or porous spheres and can be used in multi-layer devices. Examples of preparation of such structures are described in the Examples section.

The porous mesh or porous spheres may comprise carbon nanowires and a cross-linked polysaccharide. The porous mesh of the light-transmissive electrode layer may be formed by a reaction of a cross-linkable polysaccharide and a cross-linking agent. The cross-linking agent may be a salt of a divalent metal or a salt of a trivalent metal. The divalent metal or the trivalent metal may be selected from the group consisting of calcium, magnesium, strontium, barium, zinc, copper, cobalt, nickel, gallium, aluminum, iron, and mixtures thereof. The cross-linked polysaccharide may be selected from the group consisting of a cross-linked chitosan, a cross-linked alginate, and mixtures thereof. The cross-linked chitosan and the cross-linked alginate may be formed by a reaction between a chitosan anion or an alginate anion with a calcium salt.

The multi-layer device may further comprise a functional layer. The functional layer may be an electro-optic material layer, comprising a binder and an electrophoretic medium encapsulated in microcapsules. The functional layer may comprise liquid crystals. The functional layer may comprise n-type and p-type polymers, or small molecules that can transport electrons and holes. The multi-layer device may be a solar cell or a flexible electronic device.

The porous mesh of the light-transmissive electrode layer may be formed by a fast addition of an aerated aqueous mixture of a polysaccharide anion and carbon nanotubes or carbon nanowires into an aqueous solution of a salt of a divalent or trivalent metal. The polysaccharide may be an alginate and the divalent or trivalent metal is calcium. The porous spheres of the light-transmissive electrode layer may be formed by a slow addition of an aerated aqueous mixture of a polysaccharide anion and carbon nanotubes or carbon nanowires into an aqueous solution of a salt of a divalent or trivalent metal. The polysaccharide may be an alginate and the divalent or trivalent metal may be calcium. The alginate may be an alginate anion having a sodium, potassium, or lithium counterion.

The porous mesh and porous spheres comprising a conductive polymer and a cross-linked polysaccharide can be used to form light-transmissive electrode layers for multi-layer devices. The cross-linked polysaccharide may be formed by a reaction of a cross-linkable polysaccharide and a cross-linking agent. The cross-linking agent maybe a salt of a divalent metal or a salt of a trivalent metal. The cross-linked polysaccharide may be selected from the group consisting of a cross-linked chitosan, a cross-linked alginate, and mixtures thereof. The cross-linked chitosan and the cross-linked alginate may be formed by a reaction between a chitosan anion or an alginate anion with a calcium salt.

EXAMPLES

Example 1: Preparation of Sodium Alginate Solution

Aqueous solution of sodium alginate was prepared comprising 7 weight percent of sodium alginate in deionized water. The preparation included addition of the desired amount of sodium alginate in deionized water and mixing using impeller at 200-400 rotations per minute (rpm) for 4 hours at room temperature. The solution was used within 4 days from its preparation.

Example 2: Preparation of Calcium Chloride Solution

Aqueous solution of calcium chloride was prepared comprising 5 weight percent of calcium chloride in deionized water. The preparation included addition of the desired amount of calcium chloride in deionized water and mixing using impeller at 200-400 rpm for 1 hour at room temperature. The solution was used within 4 days from its preparation.

Example 3: Preparation of Electrophoretic Dispersion and Sodium Alginate Mixture An amount of 5 g of the sodium alginate solution from Example 1 was mixed with 5 g of an electrophoretic dispersion. The electrophoretic dispersion comprised (a) microcapsules comprising negatively charged white particles based on TiO2 pigment and positively charged black particles based on carbon black pigment in Isopar G solvent, and (b) a polyurethane solution binder. The mixture was inserted in a cylindrical vessel and rotated at 110 rpm (roll milling) for 4 hours.

Example 4: Preparation of Calcium Chloride and Conductive Filler Particles Dispersion An amount of 2 g of the 5% calcium chloride solution from Example 2 was mixed with 2 g of an aqueous dispersion of conductive filler particles comprising 0.6 g of conductive carbon black in 1.4 aqueous medium. The mixture was inserted in a cylindrical vessel and rotated at 110 rpm (roll milling) for 0.5 hours. The prepared dispersion was used within 1 hour after its preparation.

Example 5: Preparation of Conductive Hydrogel Beads (Spray Method)

An amount of 3 g of an aqueous dispersion of conductive filler particles comprising 0.9 g of conductive carbon black in 2.1 g of aqueous medium was mixed with 3 g of the 7% solution from Example 1. The mixture was inserted in a cylindrical vessel and rotated at 110 rpm (roll milling) for 4 hours. The freshly prepared mixture was then sprayed in a container containing 1 L of the 5 weight % calcium chloride solution from Example 2. Various experiments were performed using different sizes of the spray nozzles, preparing dispersions having conductive hydrogel beads with average diameter of 15 µm, 20 µm, 75 µm, 80 µm, 100 µm, 150 µm, 170 µm, and 850 µm. Microphotographs of such conductive hydrogel beads are shown in FIGS. 14A-14H. The size of the average diameter of the beads for each example was controlled by the diameter of the spray nozzle used. All the prepared dispersions of conductive hydrogel beads were sieved prior to their use in a multi-layer device.

Figure 15:
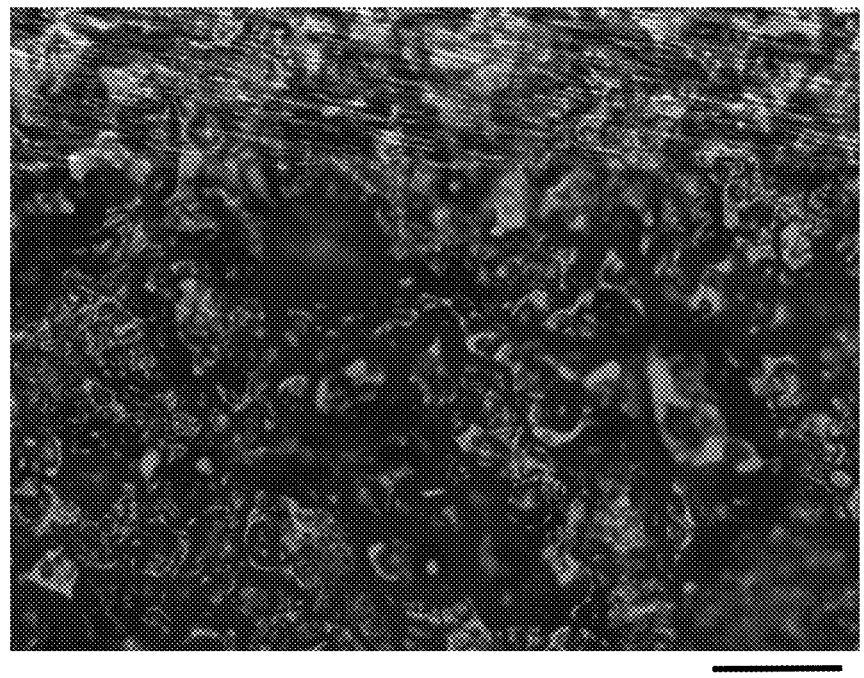
FIG. 15 shows a microphotograph of a repair layer comprising conductive hydrogel beads; the beads were fabricated via spray gun atomization of an aqueous dispersion of carbon black and sodium alginate into an aqueous solution of calcium chloride.

Example 6: Preparation of a Film by a Dispersion Comprising Conductive Hydrogel Beads An aqueous dispersion comprising conductive hydrogel beads having average diameter of approximately 30 µm was coated onto a surface and dried. A microphotograph of the film is provided in FIG. 15.

Example 7

Figure 16:
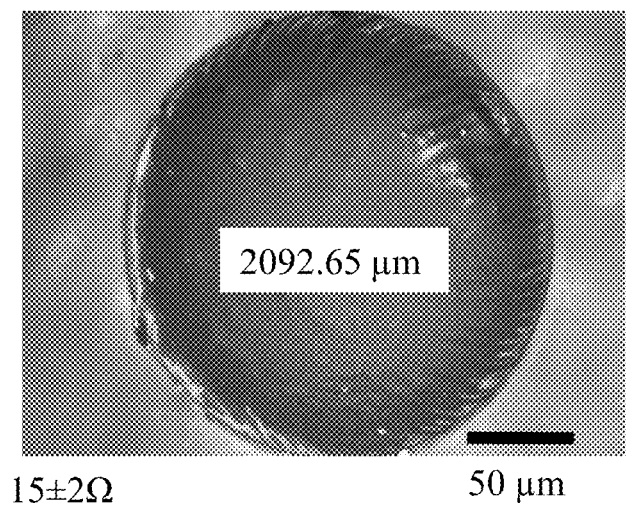
FIG. 16 shows a microphotograph of a conductive hydrogel bead formed by dropwise addition of a dispersion mixing an aqueous dispersion comprising carbon black and sodium alginate into an aqueous solution of calcium chloride.

Preparation of Conductive Hydrogel Beads (Dropwise addition method). An amount of 3 g of an aqueous dispersion of conductive filler particles comprising 0.9 g of conductive carbon black in 2.1 g of aqueous medium was mixed with 3 g of the 7% solution from Example 1. The mixture was inserted in a cylindrical vessel and rotated at 110 rpm (roll milling) for 4 hours. The freshly prepared mixture was then dropwise added in a container containing 1 L of the 5 weight % calcium chloride solution from Example 2. FIG. 16 is a microphotograph of the resulting bead. Its diameter is approximately 2 mm. The electrical resistance of the bead was measured by a multimeter by measuring the electric current through the bead generated by the application of a known voltage at two ends of the bead. The conductivity was determined to be 15 Ohms.

Example 8: Preparation of a Multi-Layer Device from Examples 3 and 4

The mixture from Example 3 was coated via spray coating on an assembly that comprised a first electrode layer on a 5 mil substrate to form a wet functional material coating. The first electrode layer was light-transmissive comprising indium tin oxide (ITO), Mixture from Example 4 was spray coated on the wet functional material coating with coat weight of 21 grams per square meter (gsm). The final multi-layer device was cured at 140° F. for 30 min in hot air flow booth to form a functional layer and a repair layer.

Example 9: Preparation of a Multi-Layer Device

Dispersion from Example 3 was coated via spray coating on an assembly that comprised a first electrode layer on a 5 mil substrate to form a wet functional material coating. The first electrode layer was fight-transmissive comprising indium tin oxide (ITO). Mixture from Example 5 was spray coated on the wet functional material coating with coat weight of 21 grams per square meter (gsm). The final multi-layer device was cured at 140° F. for 30 min in hot air flow booth to form a functional layer and a repair layer.

Example 10: Evaluation of Devices

A dried film from Example 6 was characterized for surface roughness by optical metrology using Ametek zygo equipment and by Scanning Electron Microscopy (SEM) using FEI Quanta 200F equipment. Thickness uniformity across the film were determined by taking micrographs of a cross section of the film using optical microscope (LeicaVZ700C). Coat weight measurement of a layer were performed by cutting a strip (1 inch×6 inch) of the cross section of the device, removing a layer from the strip and subtract the total weight of the strip before and after the removal. The measurement was repeated 4 times at different locations of the device. The thickness of the dried films was relatively uniform.

Figure 17:
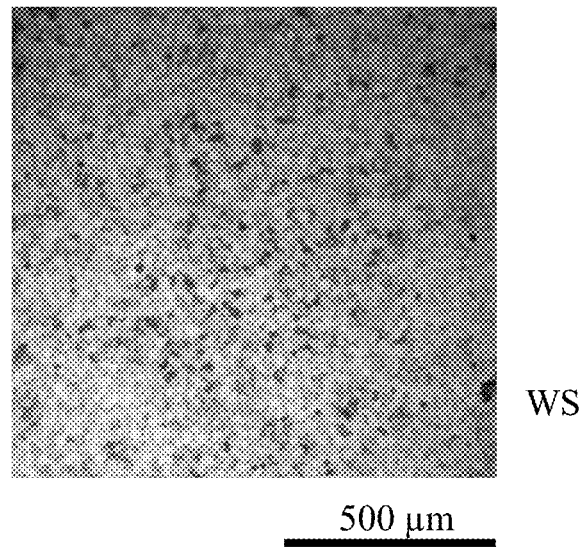
FIGS. 17 and 18 show microphotographs of the white state and the dark state of an electro-optic display device that comprises a first electrode layer, a repair layer having a conductive hydrogel film, and an electro-optic material layer comprising encapsulated electrophoretic medium.
Figure 18:
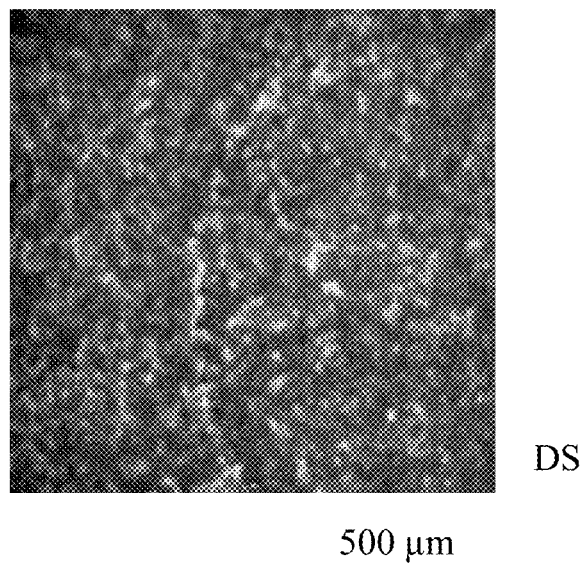

Electro-optic performance of the device were done by forming two different optical states (black and white) and measuring the color of the optical state (L*a*b*) via color computer. The optical states were formed by applying voltages in the range of 0 to ±30V on a 2 inch×2 inch pixel. The white state has reflectance L* value of 66 and the dark state has reflectance value of 25. Microphotographs of the white state and the dark state are shown in FIGS. 17 and 18 respectively.

Example 11: Synthesis of Wet Porous Mesh

Figure 19A:
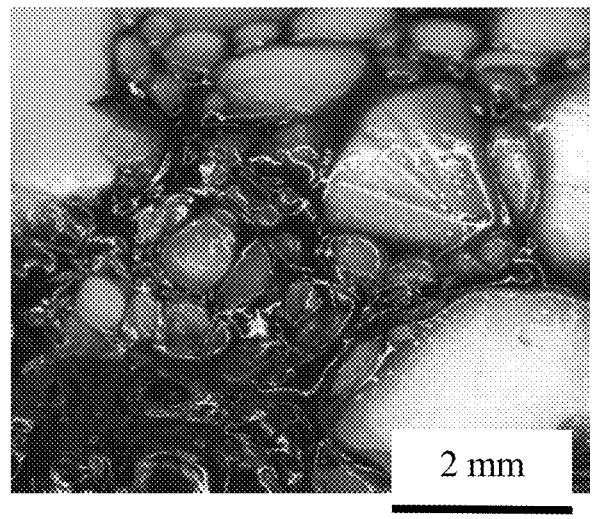
FIG. 19A is a microphotograph of a porous mesh structure.
Figure 19B:
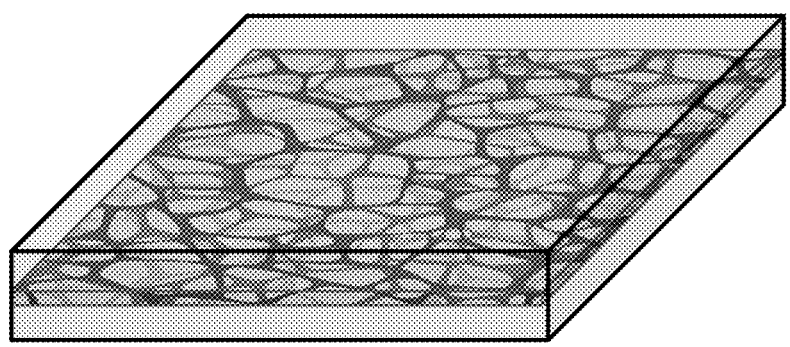
FIG. 19B is a graphical illustration of a porous mesh structure.

An amount of 5 g of sodium alginate solution from Example 1 was mixed with 5 g of 1 weight percent of aqueous single wall carbon nanowires dispersion supplied by Sigma Aldrich. An amount of 55 g of deionized water was added to reduce the viscosity of the mixture viscosity to 100 cps. A foam from the mixture was formed by bubbling air into the mixture. The foam was scooped and dispersed in 5% calcium chloride mixture from Example 2. A structure of wet porous mesh was formed on the upper surface of the container. A sample of the structure of the wet porous mesh was placed on a glass slide and was inserted into an optical microscope. The acquired microphotograph is shown in FIG. 19A. FIG. 19B shows a graphical illustration of the wet porous mesh structure.

Example 12: Synthesis of Porous Spheres

Figure 20A:
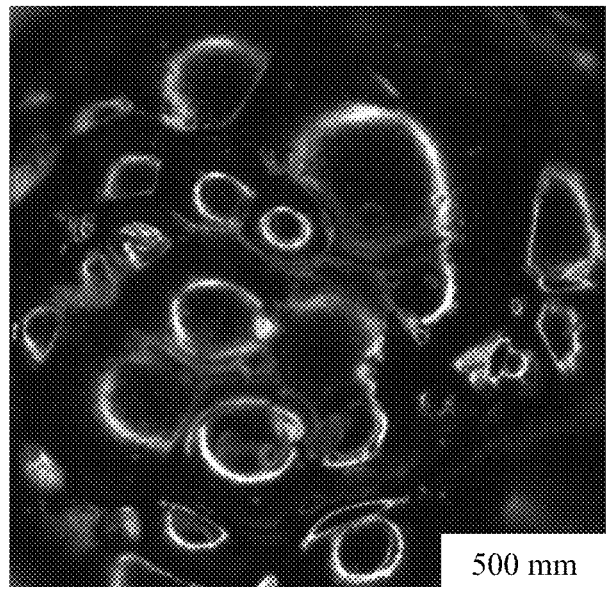
FIG. 20A is a microphotograph of a structure comprising porous spheres.
Figure 20B:
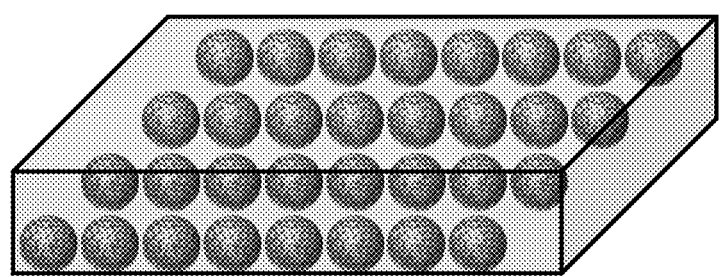
FIG. 20B is a graphical illustration of a structure comprising porous spheres.
Figure 21A:
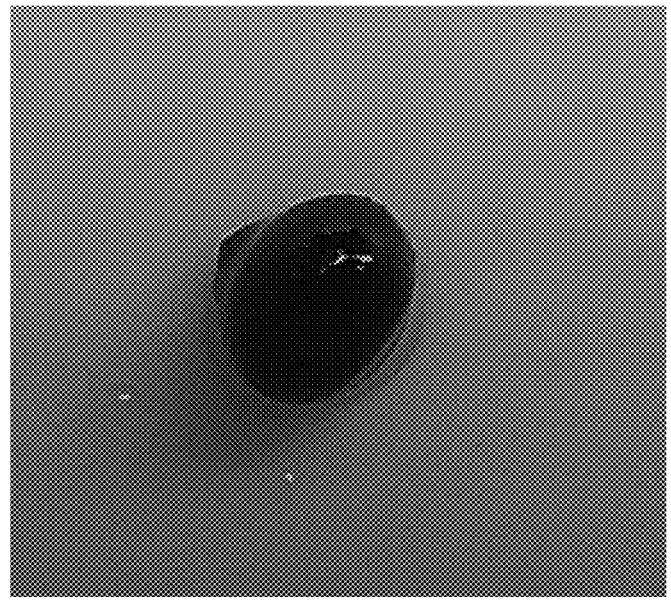
FIG. 21A is a microphotograph of a structure comprising conductive polymer spheres.
Figure 21B:
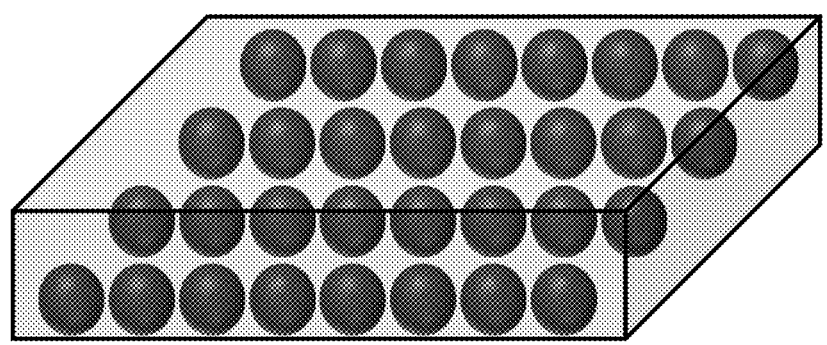
FIG. 21B is a graphical illustration of a structure comprising conductive polymer spheres.

An amount of 5 g of sodium alginate solution from Example 1 was mixed with 5 g of 1 weight percent aqueous single wall carbon nanowires dispersion supplied by Sigma Aldrich. A foam from the mixture was formed by bubbling air into the mixture. The foam was dispersed in the calcium chloride solution from Example 2 using a syringe with a needle, wherein the needle was inserted under the upper surface of the calcium chloride solution. A structure of porous spheres was formed on the upper surface of the container. A sample of the structure of the porous spheres was placed on a glass slide and was inserted into an optical microscope. The acquired microphotograph is shown in FIG. 20A. FIG. 20B shows a graphical illustration of the porous spheres structure.

Example 13: Synthesis of Spheres Comprising Conductive Polymer

An amount of 5 g of sodium alginate solution from Example 1 was mixed with 5 g of a 1 weight percent aqueous dispersion of poly(3,4-ethylenedioxythiophene) polystyrene sulfonate (PEDOT: PSS) supplied by Sigma Aldrich. The resulting dispersion was mixed with the calcium chloride solution of Example 2 by spraying the dispersion in the calcium chloride solution using a spray nozzle. A structure of spheres comprising the conductive polymer was formed on the upper surface of the container. A sample of the structure was placed on a glass slide and was inserted into an optical microscope. The acquired microphotograph is shown in FIG. 20A. FIG. 20B shows a graphical illustration of the structure comprising conductive polymer.

I claim:

1. A multi-layer device including a light-transmissive electrode layer and a functional layer, the light-transmissive electrode layer comprising a dry porous mesh, the dry porous mesh comprising carbon nanotubes or carbon nanowires, and a cross-linked polysaccharide formed by a reaction of a cross-linkable polysaccharide and a cross-linking agent that is a salt of a divalent or trivalent metal,
   wherein the light-transmissive electrode layer transmits 60 percent or more of incident visible light such that images and colors present in an underlying layer of the multi-layer device, are visible to an observer looking through the light-transmissive electrode layer, and
   wherein the functional layer is an electro-optic material layer comprising a binder and an electrophoretic medium encapsulated in microcapsules, or
   wherein the functional layer comprises liquid crystals, or
   wherein the multi-layer device is a flexible organic electro-optic device or light emitting diode, and the functional layer comprises a component selected from the group consisting of an insulator, a capacitor, a resistor, an n-type transistor, a p-type transistor, a polymer, a small molecule, and combinations thereof, that can transport electrons or holes.

2. The multi-layer device of claim 1, wherein the divalent or trivalent metal is selected from the group consisting of calcium, magnesium, strontium, barium, zinc, copper, cobalt, nickel, gallium, aluminum, iron, and mixtures thereof.

3. The multi-layer device of claim 1, wherein the cross-linked polysaccharide is selected from the group consisting of a cross-linked chitosan, a cross-linked alginate, and mixtures thereof.

4. The multi-layer device of claim 3, wherein the cross-linked chitosan and the cross-linked alginate are formed by a reaction between a chitosan anion or an alginate anion with a calcium salt.

5. The multi-layer device of claim 1, wherein the dry porous mesh of the light-transmissive electrode layer is formed by a fast addition of an aerated aqueous mixture of a polysaccharide anion and carbon nanotubes or carbon nanowires into an aqueous solution of a salt of a divalent or trivalent metal.

6. The multi-layer device of claim 5, wherein the polysaccharide is an alginate and the divalent metal is calcium.

* * * * *